United States Patent [19]

Lackey, Jr. et al.

[11] Patent Number: 5,108,983
[45] Date of Patent: Apr. 28, 1992

[54] METHOD FOR THE RAPID DEPOSITION WITH LOW VAPOR PRESSURE REACTANTS BY CHEMICAL VAPOR DEPOSITION

[75] Inventors: Walter J. Lackey, Jr., Marietta; E. Kent Barefield, Decatur; William B. Carter, Atlanta; John A. Hanigofsky, Smyrna; David N. Hill, Chamblee, all of Ga.

[73] Assignee: Georgia Tech Research Corporation, Atlanta, Ga.

[21] Appl. No.: 439,843

[22] Filed: Nov. 21, 1989

[51] Int. Cl.$^5$ .......................... B05D 5/12; C23C 16/00
[52] U.S. Cl. .......................... 505/1; 505/734; 505/737; 505/704; 427/62; 427/255.3; 427/255.2; 427/255.1; 427/248.1
[58] Field of Search .............. 505/1, 743, 730, 737, 505/704; 427/62, 63, 248.1, 255.3, 255.2, 255.1, 255, 166

[56] References Cited
U.S. PATENT DOCUMENTS

| | | | |
|---|---|---|---|
| 3,852,098 | 12/1974 | Bloss et al. | 427/226 |
| 4,054,686 | 10/1977 | Newkirk et al. | 427/62 |
| 4,128,121 | 12/1978 | Sigsbee | 164/46 |
| 4,182,783 | 1/1980 | Henery | 427/248.1 |
| 4,202,931 | 5/1981 | Newkirk et al. | 428/662 |
| 4,325,988 | 4/1982 | Wagner | 427/160 |
| 4,571,350 | 2/1986 | Parker et al. | 427/109 |
| 4,590,096 | 5/1986 | Lindner | 427/109 |

OTHER PUBLICATIONS

Tsuruoka et al., "Characteristics of the Quenched Y—Ba—Cu—O Thin Films on SrTiO$_3$ (100), (110) Grown by Organometallic Chemical Vapor Deposition" Appl. Phys. Lett. 54(18) May 1989, pp. 1808–1809.

Yamane et al., "High Critical-Current Density of Y-Ba-Cu14 O Superconducting Films Prepared by CVD" Supercond. Sci. Techol. 2 (1989), pp. 115–117.

Koukitu et al., "Preparation of Y-Ba-Cu14 O Superconducting Thin Films by the Mist Microwave Plasma Decomposition Method" Jpn. J. Appl. Phys., vol. 28 (7) Jul. 1989 L1212–1213.

Inoue et al., "Preparation of Y-Ba-Cu-O Thin Films by the CVD Method in a Vacuum-Evaporation-Type Reactor" Jpn. J. Appl. Phys., vol. 28(9), Sep. 1989, L1575–1577.

Hollabough, C. M., et al., "Chemical Vapor Deposition of ZRC Made by Reactions . . . .", 35 (9) Nucl. Tech. 527–535 (1977).

Primary Examiner—Shrive Beck
Assistant Examiner—Roy V. King
Attorney, Agent, or Firm—Hurt, Richardson, Garner, Todd & Cadenhead

[57] ABSTRACT

A method for applying coatings to substrates using chemical vapor deposition with low vapor pressure reagents is disclosed which comprises the steps of: (a) placing a substrate in a furnace means; (b) directly introducing powder reagents by a powder feeder means into said furnace means; and (c) vaporizing and reacting said reagents within said furnace means resulting in the deposition from the vapor phase of a coating on said substrate, wherein said coating can be an oxide superconductor.

15 Claims, 8 Drawing Sheets

METHOD FOR THE RAPID DEPOSITION WITH LOW VAPOR PRESSURE REACTANTS BY CHEMICAL VAPOR DEPOSITION

BACKGROUND OF THE INVENTION

1. Field of the Invention

This invention relates to the rapid deposition of coatings on substrates by chemical vapor deposition using low vapor pressure reactants and, more specifically, to the use of powder feeding of the low vapor pressure reactants into the chemical vapor deposition furnace.

2. Prior Art

Current techniques in chemical vapor deposition ("CVD") which use low vapor pressure reagents introduce the reactant material too slowly into the reactor, which reduces the coating deposition rate. Common solutions to this problem of reduced coating deposition rate include: running the vaporizer or reactor at reduced pressures, which increases the transport rate of the reagent into the reactor; running the reactor with a high carrier gas flow rate, which tends to dilute the reactant gas stream since saturation may not be achieved; or heating the solid or liquid reactants to a high temperature, which increases the vapor pressure above the reactant.

Current coating techniques usually do not include the powder feeding or liquid feeding of low vapor pressure reactants to increase the deposition rate. One introduction technique consists of a process where reagents which are dissolved to form a liquid solution are then sprayed into a furnace to form a powder of superconducting oxides. One coating technique consists of a process where substrates are coated with superconducting oxides by spraying the substrates with or dipping the substrates in liquid reactants. These, however, are not CVD processes and do not result in an atom-by-atom build-up of the coating. These coatings, therefore, do not possess the high degree of crystalline perfection found in CVD coatings.

Previous CVD techniques have used an auger to feed $ZrCl_4$ powder into a CVD furnace as an alternative to the use of a vaporizer. See Hollabough, C. M., L. A. Haham, R. D. Reiswig, R. W. White, and P. Wagner, Chemical Vapor Deposition Of ZrC Made By Reactions Of $ZrCl_4$ With $CH_4$ And With $C_3H_6$, 35, (9), NUCL. TECH., 527-35 (1977). This approach used powder feeding of $ZrCl_4$ as a reagent to CVD furnaces instead of using a vaporizer. However, the powder feeding method was used in place of a vaporizer because, depending on the CVD furnace design, it is sometimes difficult to keep the portion of the reagent gas line connecting a vaporizer with a CVD furnace at a sufficiently high temperature. This approach was used not because the vapor pressure of the reactant, $ZrCl_4$, is low or because heating of $ZrCl_4$ renders it unstable, but because a relatively high temperature is required to develop the desired vapor pressure and maintaining the high temperature throughout the gas lines going to the furnace often is difficult.

Newkirt et al. U.S. Pat. No. 4,202,931 dicloses the use of a powder feeder to prepare a $Nb_3Ge$ low temperature superconductor. However, use of a powder feeder was known prior to this patent, as disclosed in Newkirk et al. U.S. Pat. No. 4,054,686. See also the paper by Hollabough et al. referenced above. Newkirt et al. U.S. Pat. No. 4,202,931, disclosed the use of a powder feeder to improve the control or accuracy of $NbCl_5$ dispensing.

None of the prior art techniques have been applied to the powder feeding of the new generation of high temperature superconducting oxides, into CVD furnaces, nor have they been designed to achieve the high deposition rates desired for superconductors and other materials. The prior art techniques are suitable for the deposition of Nb and Zr compounds, as high deposition rates for these compounds can be achieved without powder feeding, for example, by vaporization of $NbCl_5$ and $ZrCl_4$. Vaporization cannot yield the high deposition rates for oxide superconductors, because oxide superconductor reagents have very low vapor pressures and cannot be practically (i.e., rapidly) introduced into a CVD furnace using vaporization techniques.

The vapor pressure data of FIG. 7 permits clarification of this point. The graph is a compilation of reagent vapor pressures obtained from the literature. Curves 1-8 are for yttrium, barium, and copper reagents used for the CVD of $YBa_2Cu_3O_x$ which are considered low vapor pressure reagents. Curves 9-14 are for other reagents which commonly are used for CVD of other materials which are considered high vapor pressure reagents. Two points are of interest; first, the vapor pressures of the yttrium, barium, and copper reagents are very low compared to the typical CVD reagents; second, the large discrepancy in vapor pressure of yttrium tetramethylhepatanedionate from the four literature sources (curves 2, 5, 7, and 8) is indicative of the difficulty in developing a controllable, repeatable CVD process which relies on sublimation of the beta-diketonates in vaporizers. Our experience, and that of others, has been that the vapor pressure, and therefore flowrate of reagent from a vaporizer, varies with time and from lot-to-lot of reagent. The strong variation of vapor pressure with temperature, even for a given source, is evident from FIG. 7. This necessitates very close control of vaporizer temperature if a controllable flowrate of reagent is to be achieved. Three such vaporizers are involved in the conventional CVD of $YBa_2Cu_3O_x$.

Curves 10 and 11 in FIG. 7 are for $ZrCl_4$ and $NbCl_5$. These reagents have sufficiently high vapor pressures, e.g. 100 torr, within the temperature range over which they are stable and thus can be supplied by use of either vaporizers or by powder feeding. However, FIG. 7 shows that the vapor pressures of the yttrium, barium, and copper reagents (Curves 1-8) do not exceed about 0.1 torr. If these latter reagents are heated to higher temperatures than those shown in FIG. 7 in an attempt to obtain higher vapor pressures, these reagents decompose rapidly to form non-volatile compounds.

Thus, when the reagents $ZrCl_4$ and $NbCl_5$ were introduced via powder feeding in the prior art, it was merely at the discretion of the investigator as a matter of convenience and as an attempt to improve the accuracy of reagent flowrate, rather than for the purpose of increasing deposition rate. As $ZrCl_4$ is not a superconductor reagent, it does not have a relevant $T_c$, and the $T_c$ of $Nb_3Ge$ is about 20K, which is much lower than the $T_c$ of about 84K of the superconductor materials used in this invention. However, in the case of the very low vapor pressure reagents, the use of powder feeding is mandatory in order to achieve high deposition rates, and also maintains the control over reagent flowrate (i.e. process repeatability) much more so than in the case of high vapor pressure reagents such as $ZrCl_4$ and NbCl$_5$ where vapor pressures can be controlled easily and are highly reproducible.

Chemical vapor deposition is used extensively for the commercial preparation of numerous electronic, optical, tribological, and chemically protective coatings. Compared to other coating processes, CVD is often faster, yields higher quality, more adherent films, and can be used to coat multiple, irregularly shaped substrates. Films of the high T$_c$ oxide superconductor YBaYBa$_2$Cu$_3$O$_x$ have been prepared by CVD. Typical reagents used in CVD processes for the oxide superconductors have consisted of metal complexes of various beta-diketonate ligands, which are solids at room temperature and which slowly sublime when heated to about 100°-300° C.; the vapor is then swept into the CVD system by a carrier gas. Without exception, however, the very low vapor pressure of the Y, Ba, and Cu precursor reagents has restricted deposition rates to low values, e.g. 1 micron per hour. Furthermore, the vapor pressures of the reagents are strongly dependent on temperature and are subject to change as a result of thermal-environmental induced degradation during sublimation. Hence, process control and repeatability are unusually poor.

BRIEF SUMMARY OF THE INVENTION

In this invention, a mixture of powdered reagents is fed directly into the coating furnace. This results in a faster, more controllable and potentially more economical CVD process. The higher deposition rate also permits the coating of substrates, e.g. metals, which would be damaged by prolonged exposure to a high temperature oxygen environment. This invention yields YBa$_2$Cu$_3$O$_x$ coatings on MgO crystals which are superconducting at 80-84K with preferred orientation of the crystals of the 123 phase. Superconducting wire also has been prepared by deposition of YBa$_2$Cu$_3$O$_x$ onto alumina (Al$_2$O$_3$) fibers.

This invention relates to a method and apparatus for introducing low vapor pressure solid or liquid reactants into a CVD furnace. CVD currently is being used to deposit a variety of coatings, including the new superconducting material such as, YBa$_2$Cu$_3$O$_x$, bismith compounds such as Bi$_2$Sr$_2$Ca$_2$Cu$_3$O$_{10}$, and thalium compounds such as Tl$_2$(Ca,Ba)$_2$CuO$_6$, onto appropriate substrates. In conventional CVD processing, gases are typically used to transport the reagents into the furnace, where the reagents combine to form the desired coating. When liquid and solid reactants are used in conventional CVD processing, a carrier gas is bubbled or blown over the liquid or solid reactants to transport reagent vapor into the furnace. The materials then react in the furnace to deposit the coating.

The method and apparatus of the present invention is the first use of powder feeding of yttrium, barium or copper reagents to deposit the oxide superconductors via CVD. This invention also is useful for depositing nonsuperconductors such as yttria (Y$_2$O$_3$), magnesia (MgO), barium titanate (BaTiO$_3$) and rare earth oxides, carbides, nitrides or borides using low vapor pressure reagents. The method and apparatus of the present invention achieves a faster, more reliable processing technique that successfully deposits coating materials, such as the superconductor YBa$_2$Cu$_3$O$_x$, on substrates. Additionally, the use of the powder feeding approach specifically for the purpose of avoiding problems such as low deposition rate and the poor repeatability associated with the use of very low vapor pressure CVD reagents has not been used for deposition of oxide superconductors prior to the development of the method and apparatus of this invention.

A related but alternative method of feeding reagents to the CVD furnace involves the atomization of liquids containing dissolved reagents. The atomization process is similar to powder feeding in that it allows the introduction of low vapor pressure reagents, such as those used for depositing the oxide superconductors, into CVD furnaces. Atomization has many of the same advantages of powder feeding such as application to low volatility reagents, high deposition rates, high controllability and high homogeneity. Additionally, the use of the atomization process for the purpose of avoiding problems associated with very low vapor pressure CVD reagents has not been used for the deposition of oxide superconductors prior to this invention. The process of the present invention should be amenable to the coating of the inside surface of cavities for microwave applications or for the deposition of various materials for microelectronic applications.

Accordingly, it is an object of the present invention to provide a method and apparatus for the rapid deposition of coatings by chemical vapor deposition using low vapor pressure or thermally unstable reactants.

It is also an object of the present invention to provide a rapid coating method and apparatus which has an increased deposition rate for oxide superconductors or other materials where one or more of the constituents has only low vapor pressure reagents or thermally unstable reagents.

It is a further object of the present invention to provide a rapid coating method and apparatus which has an increased deposition rate for oxide superconductors or other materials where use of low vapor pressure reagents is preferred or necessary if a high vapor pressure reagent is available but its cost is prohibitively high.

It is another object of the present invention to provide a rapid coating method and apparatus which has improved reproducibility.

It is a further object of the present invention to provide a rapid coating method and apparatus which requires simpler equipment needs and less operator skills.

It is yet another object of the present invention to produce a rapid coating method and apparatus that utilizes low cost reagents.

It is still another object of the present invention to provide a rapid coating method and apparatus which is simpler, more economical, and more reliable than previous methods.

It is another object of the present invention to produce coated wires, tapes, cavities and electronic devices using the rapid coating method and apparatus of the present invention.

These and other objects will become apparent to those skilled in the art when taken in conjunction with the following drawings and the detailed description of the method and apparatus contemplated by the present invention.

DETAILED DESCRIPTION OF THE INVENTION

1. Theoretical

The apparatus and method of the present invention is unique in several respects. First, the reagents are fed into the reactor using a powder feeder or atomization means, which results in a more reliable, repeatable deposition of the coating material onto the substrate. Second, the powder feeding approach or atomization of liquids containing dissolved reagents also is used for the purpose of avoiding problems associated with the use of very low vapor pressure CVD reagents, such as low deposition rate and poor repeatability. Third, the reagents being used to deposit the coating materials, such as the oxide superconductors including $YBa_2Cu_3O_x$ and others that are unstable at temperatures required for their vaporization.

Suitable substrates include conventional substrates used in superconductor applications, such as single crystal magnesium oxide, single crystal aluminum oxide, single crystal strontium titanate, single crystal and polycrystalline zirconia ($ZrO_2$), planar polycrystalline aluminum oxide, and aluminum oxide or other fibers. Additionally, ribbons or tapes of $Al_2O_3$, or other appropriate ceramics or metals, are also suitable substrates. Suitable reagents include the family of beta-diketonate complexes. Commonly used beta-diketonate reagents for superconductors include $Y(tmhd)_3$, $Ba(tmhd)_2$ and $Cu(tmhd)_2$ where tmhd denotes 2,2,6,6-tetramethyl-3,5-heptanedionate. Other reagents such as complexes of fluorinated beta-diketonates, acetylacetonate, acetates, and halides can be used.

Materials other than $YBa_2Cu_3O_x$ which might be coated by the method include other oxide superconductors, such as, $Bi_2Sr_2Ca_2Cu_3O_{10}$ and $Tl_2(Ca,Ba)_2CuO_6$, where one or more of the cations is supplied by the new approach of powder feeding or atomization utilized in this invention. Additionally, nonsuperconductors such as yttria ($Y_2O_3$), magnesia (MgO), barium titanate ($BaTiO_3$), ferrites and rare earth oxides, carbides, nitrides or borides can be deposited using the powder feeding or atomization process with low vapor pressure reagents.

Figure 7:
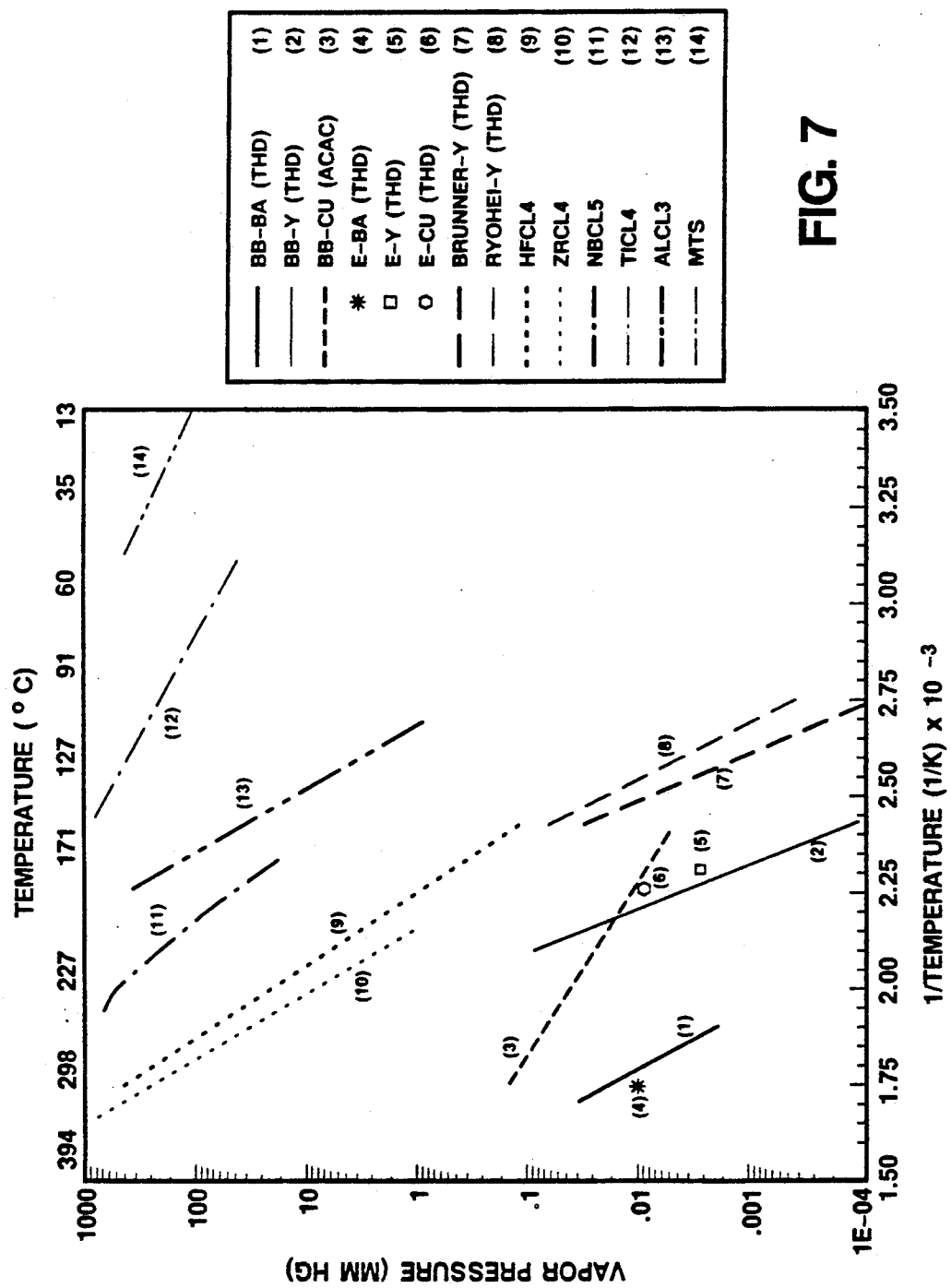
FIG. 7 is a graph showing the temperature versus vapor pressure for several reagents.

As mentioned earlier in the Background of the Invention discussing Prior Art, the vapor pressure data graphed in FIG. 7 is a compilation of reagent vapor pressures obtained from the literature. Curves 1-8 are for yttrium, barium and copper reagents, which are considered low vapor pressure reagents, while curves 9-14 are for other reagents, which are considered high vapor pressure reagents. There is a distinct break in the graph occurring at a vapor pressure of about 0.2 mm Hg, with curves 1-8 having a vapor pressure of less than about 0.1 torr and curves 9-14 having a vapor pressure of more than about 0.1 torr. It is evident from FIG. 7 that those reagents having a vapor pressure of less than about 0.1 torr are those reagents commonly known to those skilled in the art as "low vapor pressure" reagents. Therefore, the term "low vapor pressure" when applied to reagents used in CVD generally applies to reagents having a vapor pressure at less than about 0.1 torr. Two other points about this process deserve mentioning at this juncture. First, as mentioned previously, although the low vapor pressure reagents are relatively unstable at certain conditions, the instant process allows for the deposition of these reagents despite this instability. Second, no heating supply is needed for the reagent supply system, allowing the reagent supply system to operate at ambient temperature, thus eliminating as unnecessary heating sources, lines and multiple vaporizers. Elimination of vaporizers avoids the prior art problem of reagent decomposition, that is, aging.

The method and apparatus of the present invention is a unique modification of typical CVD processes which utilize low vapor pressure and/or unstable reagents. The method and apparatus of the present invention provide for a more reliable transport of the reagents into the CVD furnace for reaction and a significantly increased rate at which the reagent can be supplied and, therefore, an increased rate of coating deposition on the substrate. The shorter processing times and higher efficiency and uniformity achieved enhance practical coating technology, specifically in the area of superconductivity, and increase the economic feasibility of various coating processes such as the deposition of $Y_2O_3$, MgO, $BaTiO_3$, $SrTiO_3$, $LaAlO_3$, and $LaGaO_3$, among others.

The method and apparatus of the present invention allow a significant reduction in the quantity of reagent needed to deposit a given amount of coating since material remaining in the vaporizer is often damaged when the vaporizer approach of the prior art is used. The quantity of reagent is a very significant factor considering the cost of the reagents required to deposit the new ceramic superconductors. Furthermore, the method and apparatus of the present invention permit the use of cheaper reagents, such as acetylacetonates, acetates, oxylates, or metal halides, which are less expensive compounds.

2. Apparatus

In the deposition of several superconducting compounds as coatings onto substrates, many of the reactants have extremely low vapor pressures. Even by combining high temperature, reduced pressure, and high carrier gas flow rate, the deposition rates are extremely low, on the order of about one micron per hour. Furthermore, conventional low vapor pressure deposition processes are extremely nonreproducible because of variation of the vapor pressure with time due to the thermal/environmental degradation, or because of variations in the extent of saturation in the vaporizer. The use of a powder feeder or atomization of liquid to introduce the reactants into the CVD furnace provides a faster, more reliable processing technique to deposit the superconducting material onto a substrate. Deposition rates of 1 micron per minute have been routinely achieved; in some cases, deposition rates as high as 4 microns per minute have been achieved.

Figure 1:
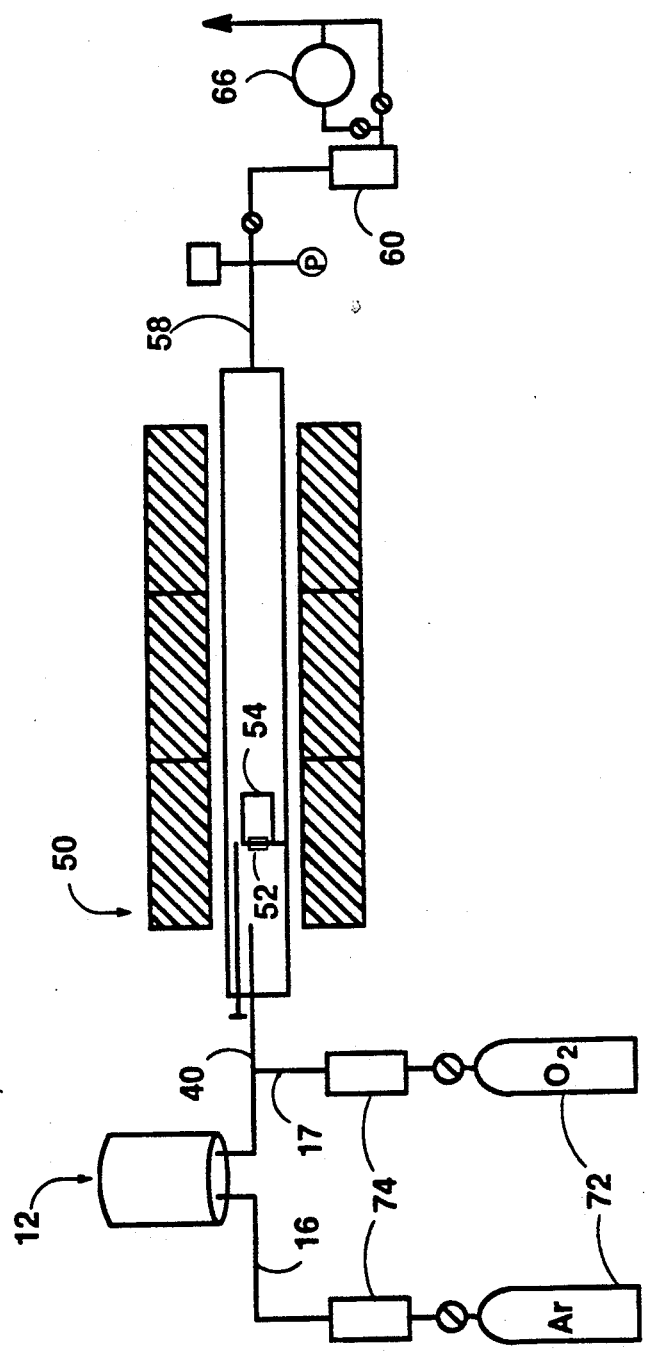
FIG. 1 is a schematic of the CVD system using a powder feeder and a horizontal furnace arrangement.
Figure 2:
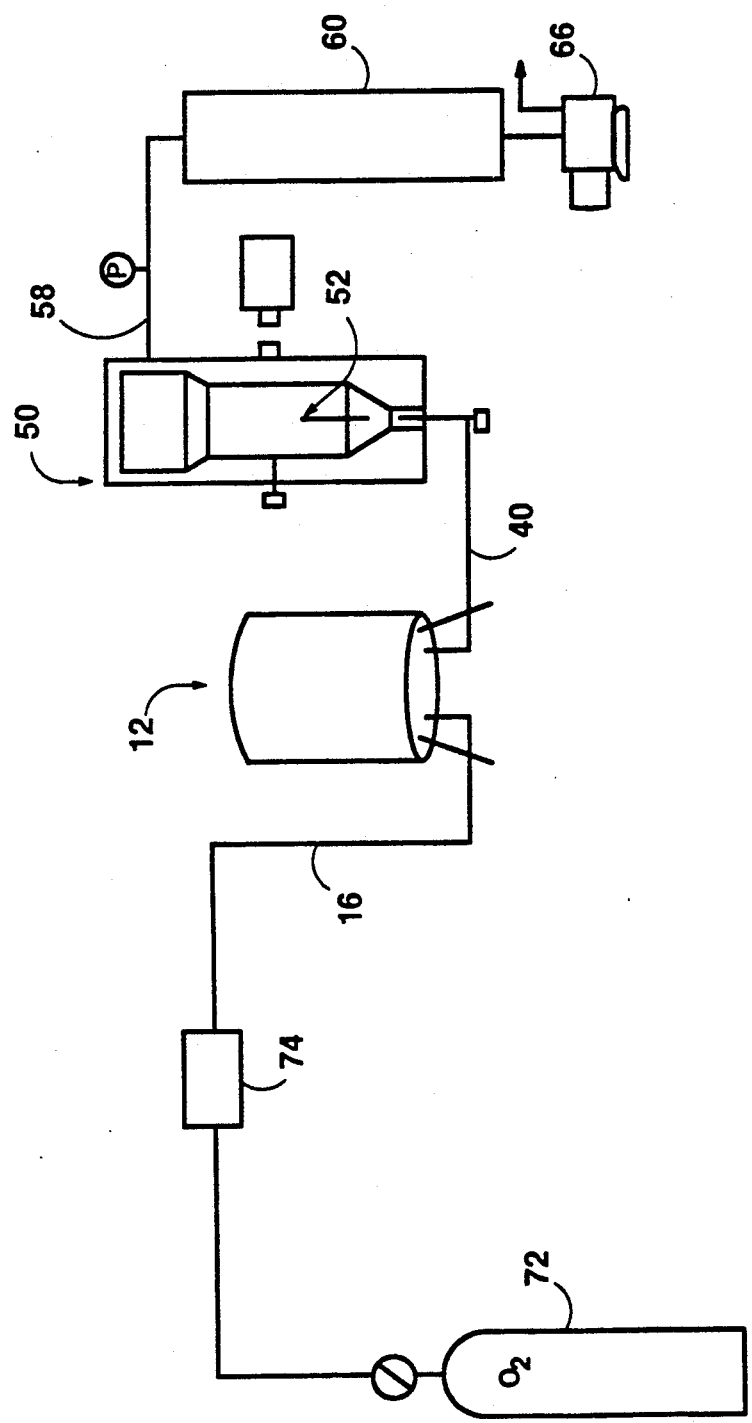
FIG. 2 is a schematic of the CVD system using a powder feeder and a vertical furnace arrangement.
Figure 3:
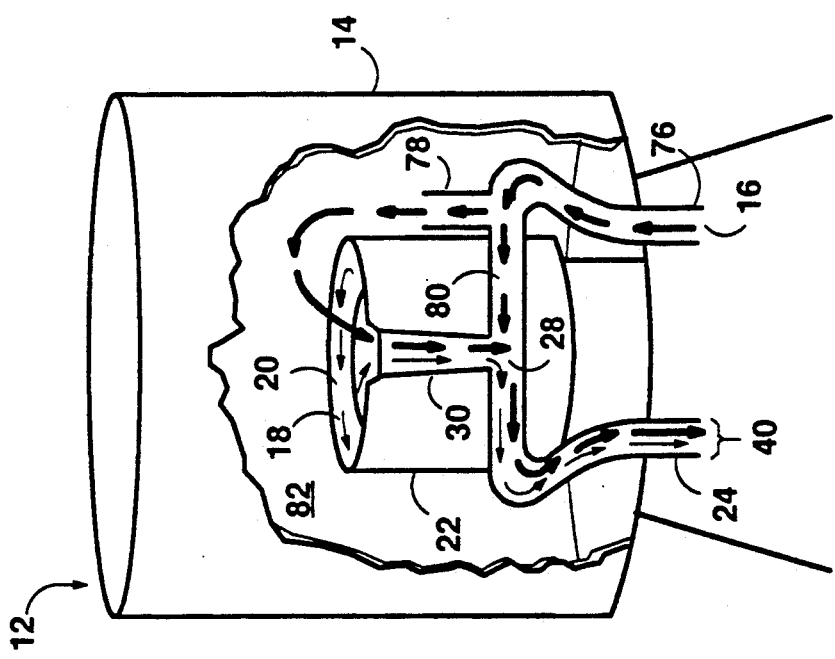
FIG. 3 is a schematic of the vibratory powder feeder for the superconductor CVD.

Two schematics of the apparatus are shown in FIGS. 1 and 2. FIG. 1 is a schematic for a horizontal furnace arrangement, which is useful for the preparation of normal substrates. FIG. 2 is a schematic for a vertical furnace arrangement, which is useful for the preparation of ceramic wire or tape. These two modes are the most useful in carrying out the process contemplated although each arrangement can be used for each of the above preparations as well as other preparations. FIG. 3 is a cutaway view of the vibratory powder feeder 12 used in the apparatus.

For example purposes only, the invention will be described below using the horizontal furnace arrangement of FIG. 1 to achieve the deposition of $YBa_2Cu_3O_x$ onto several substrates. The example reagents introduced to the CVD furnace via powder feeding to form the $YBa_2Cu_3O_x$ coating are $Y(tmhd)_3$, $Ba(tmhd)_2$ and $Cu(tmhd)_2$.

The deposition of $YBa_2Cu_3O_x$ thin films is accomplished in a low pressure, hot walled CVD reactor as shown in FIG. 1. The reagents are the beta-diketonate complexes $Y(tmhd)_3$, $Ba(tmhd)_2$ and $Cu(tmhd)_2$. The yttrium and copper complexes are prepared by minor modifications of conventional procedures and are recrystallized from hexane before use. The barium complex is prepared by reaction of 2,2,6,6,-tetramethyl-3,5-heptanedione with barium metal at 100° C., followed by dissolution in toluene and precipitation with acetonitrile at room temperature. The solid reagents are premixed and ground in air prior to deposition using a Spex model 8000 Mixer/Mill; the particles were subsequently screened below 44 microns.

A modified vibratory feeder such as a Syntron EB-051 is used to feed the powder reagent mixture slowly into the CVD furnace. The modifications to the powder feeder allow for a more uniform powder feed rate over the duration of the coating run. The powder is pneumatically transported into the furnace using argon (99.999% purity) where it vaporizes and reacts. This results in deposition of the mixed metal oxide onto the substrate. Oxygen (99.998%), which was pretreated with Ascarite and Drierite to reduce $CO_2$ and $H_2O$ impurities, is added to the inlet stream near the furnace. The flow rates for argon and oxygen are controlled using MKS mass flow controllers. The temperature is monitored using an Inconel sheathed Type K thermocouple. Typical deposition conditions are in the range summarized in Table I.

Immediately following deposition (without cooling), the system is backfilled with argon or oxygen to atmospheric pressure, and the samples are annealed at 900° C. for 30 minutes in 1 atm $O_2$ flowing at 1 liter/min. Alternatively, samples of equal quality have been obtained by omitting the annealing step. The furnace is then cooled in 2 h below 300° C. also while flowing $O_2$. Coatings are deposited on both planar and fiber substrates. Planar substrates are single crystals of MgO, $SrTiO_3$, and stabilized $ZrO_2$ and polycrystalline $Al_2O_3$, stabilized $ZrO_2$, and Ag. Fibers were Sumitomo, Nicalon, Nextel, Ag, and Saphikon (single crystal $Al_2O_3$).

|  | Range* | Preferred |
|---|---|---|
| Total Pressure (torr) | 10–760 | 20 |
| Deposition Temperature (°C.) | 500–970 | 900 |
| Argon Flowrate (l/min) | 0–5 | 5 |
| Oxygen Flowrate (l/min) | 1–5 | 1 |
| Deposition Time (min) | 5–30 | 30 |
| Input Reagent Mass Ratio $Y(tmhd)_3$:$Ba(tmhd)_2$:$Cu(tmhd)_2$ | 1:(1.25–2.01):(1.51–2.56) | 1:1.38:1.51 |
| Total Reagent Mass (g) | 2–10 | 1.75 |

*The present invention is operative outside of this range

Argon or oxygen is used as a carrier gas 16 and may be supplied from any conventional source such as refillable tanks 72. The flow rate of the carrier gas 16 is controlled by a conventional mass flow controller 74. The carrier gas 16 is introduced to the vibratory feeder 12 through input line 76. Input line 76 splits into two lines, an ambient line 78 and an carrier stream line 80. Ambient line 78 introduces the carrier gas 16 into the main vacuum cavity 82 of the vibratory feeder 12.

The vibratory powder feeder 12 is enclosed in a stainless steel chamber 14 to ensure a vacuum seal. Flowing carrier gas 16 is used as a pneumatic transport to assist in carrying the solid powder 18, which is vibrated around a track 20 at a uniform rate inside the bowl 22, through the lines 24 and into the furnace 50.

When the vibratory feeder 12 is in operation, the powder 18 is vibrated around a track 20 inside the vibratory feeder bowl 22. The powder 18 is forced from the track 20 and is entrained in the carrier gas 16 flowing down the tube 30 located in the center of the bowl 22. The powder 18 entrained in the ambient carrier gas 16 merges with the carrier gas 16 contained in the carrier stream 28 forming a carrier gas powder output stream 40 which is carried along output line 24 to the furnace 50.

The rotary bowl powder feeder is a Syntron EB-051 parts feeder from FMC with several modifications, although rotary bowl powder feeders, including nonvibratory feeders, from other manufacturers can be used, if the appropriate modifications are made. These modifications include a tee 26 which has been attached at the exit lip of the bowl 22. The tee 26 causes the powder 18 to fall into carrier stream 28. Carrier gas 16 is also used to assist in carrying the powder 18 down through tube 30 into carrier stream 28. A second modification to the rotary bowl 22 is that two spots along the powder ramp have been restricted to about one sixteenth (1/16) of an inch. This modification allows the rotary bowl 22 to disperse powder at a more uniform rate. The reactant powder 18 is ground to below about forty-four (44) microns in diameter, although the exact diameter of the powder is not critical, using a mixer/mill prior to introduction to the vibratory feeder 12.

The substrate 52 to be coated is retained in a substrate holder 54 in the furnace 50. The furnace is heated to a temperature to between about 500° and about 970° C. which is held constant during the deposition process. The carrier gas-reagent powder stream 40 enters the furnace 50 and is deposited on the substrate 52. When argon is used as the carrier gas 16, a stream of flowing oxygen 17 also is brought to the inside of the furnace. The thickness of the coating deposited on the substrate is controlled by the temperature and pressure of the furnace and the amount of reagent introduced into the furnace 50. The powder feed rate as well as the duration of the run may be altered in order to vary the final coating thickness.

Figure 8:
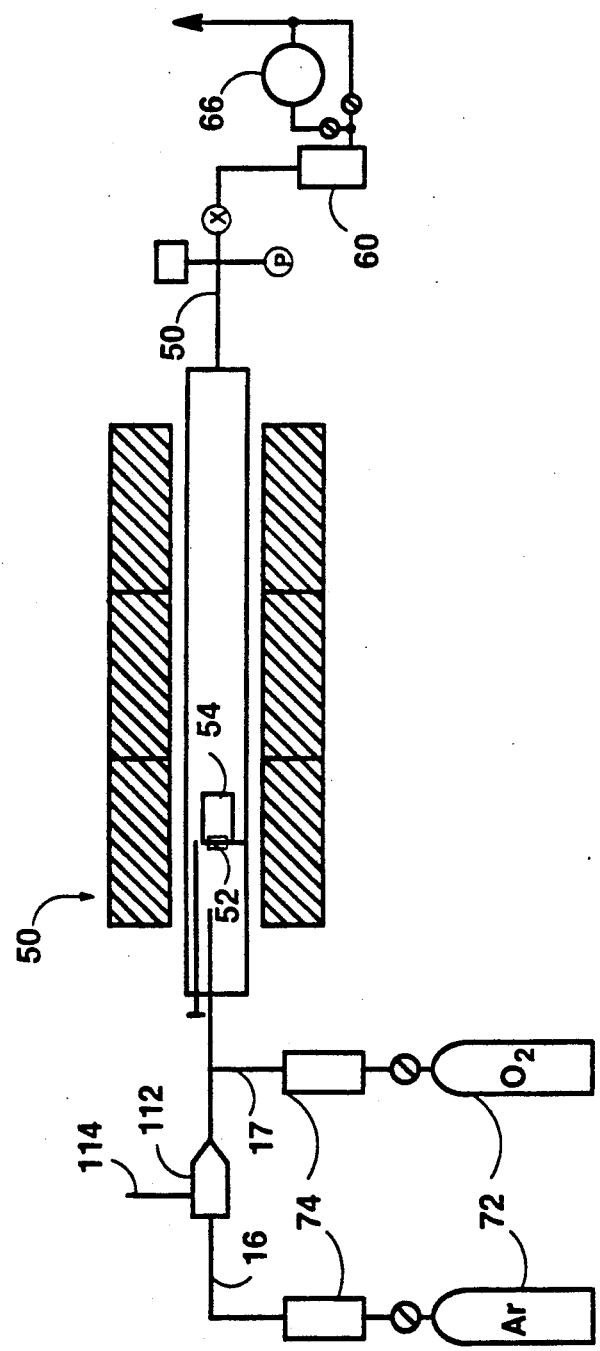
FIG. 8 is a schematic of the CVD system using an atomizer and a horizontal furnace arrangement.

Alternatively, an atomizer can be used in place of the powder feeder. FIG. 8 shows this alternate embodiment. The atomizer 112 is placed in the carrier gas 16 line at the same point where the powder feeder 12 would be placed. Liquid reagents or reagents dissolved in a solvent are fed to the atomizer 112 through feed line 114. Carrier gas 16 flows through the atomizer 112 and carries the reagents downstream. As the dissolved reagents flow through the atomizer, the solvent evaporates and reagents particles are produced, resulting in the introduction of a powder to the furnace 50 similar to the powder introduced to the furnace 50 using the powder feeder apparatus. For solid reagents dissolved in a solvent, solid particles are formed. For liquid reagents or reagents dissolved in a solvent, liquid particles are formed. The carrier gas-atomized reagent stream, along with the evaporated solvent, 140 enters the furnace 50 and is deposited on the substrate 52. When argon is used as the carrier gas 16, a stream of flowing oxygen 17 also is brought to the inside of the furnace. The thickness of the coating deposited on the substrate is controlled by the temperature and pressure of the furnace and the amount of reagent introduced into the furnace 50. The feed rate as well as the duration of the run may be altered in order to vary the final coating thickness.

Excess and/or decomposed reagent, carrier gas and oxygen leave the furnace through exit line 58 and enter a scrubber 60. The exhaust gas is scrubbed to remove any acidic and condensable gases and particulates. The excess exhaust gases are pumped through pump 66 and exhausted into the atmosphere.

The carrier gas-powder mixture 40 is introduced into the furnace 50 where the powdered reagents vaporize and subsequently react at the substrate material surface similar to other CVD processes. This process is repeatable, reliable, and provides a faster deposition rate compared to approaches which rely on transport of vapor from low vapor pressure and/or unstable reagents into the CVD furnace.

The powder feeding technique of the method and apparatus of the present invention can be used for any low vapor pressure reactant compounds used in CVD processes. Specific systems where the process does apply include superconducting compounds, such as $YBa_2Cu_3O_x$ and the Bi-Sr-Ca-Cu-0 and Tl-Ca-Ba-Cu-O compounds. One or more or all of the cations may be supplied by the powder feeding or atomization process to form superconductors which contain elements for which only low vapor pressure, unstable, or expensive reagents exist. Alternatively, this invention may be used to deposit single or double oxides or other compounds containing the troublesome cations.

In addition to a vibratory feeder, the powder feeder can be any type of auger or other powder feeder type or pump in which powder or liquid can be fed uniformly into a CVD furnace. A liquid feed system, which atomizes a solution containing dissolved or slurried reagents, that is, makes the liquid into droplets which dry to yield small powder particles of the reagent can be used. Using such an atomizer system, the low vapor pressure compounds are dissolved in a liquid, such as carbon tetrachloride or hexane, and introduced into a gas stream through a nozzle. This process produces very fine powder particles which are then carried by the gas stream into the furnace. Alternatively, the atomization and subsequent powder formation could occur inside the furnace.

For those reagents which are liquids at room or a moderately elevated temperature (approximately 16°–100° C.), the atomization method is suitable. The liquid droplets introduced to the CVD system through atomization vaporize to form gaseous reagents inside the furnace.

3. Results

Figure 5:
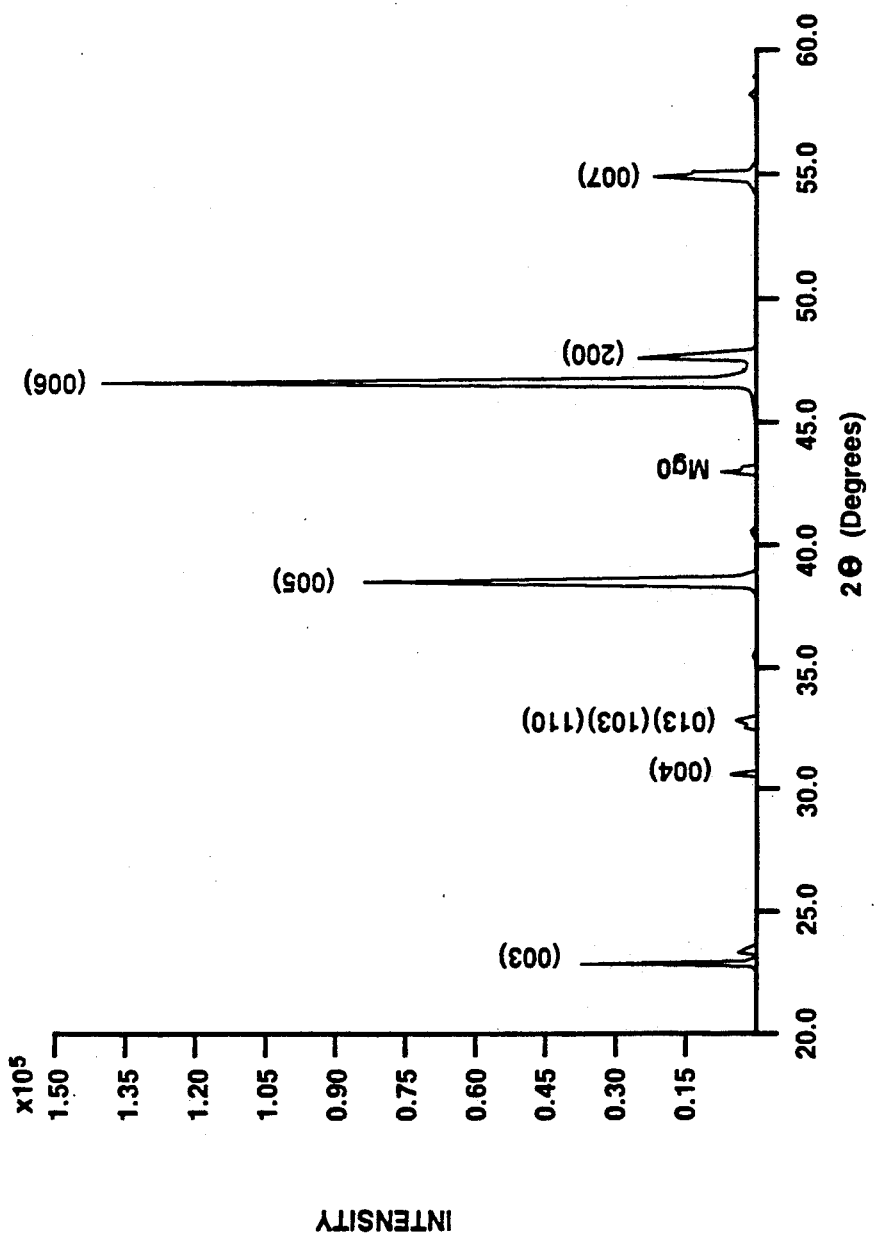
FIG. 5 is a sample x-ray diffraction pattern of a sample coating.

The unique reagent feed system results in deposition rates over one order of magnitude greater than those achieved previously using reagent sublimation techniques (e.g. 200 microns/h vs 1–10 microns/h). A deposition rate of 240 microns/h has been achieved. The coatings appear smooth, black, uniform and adherent to MgO. Most coatings on planar substrates show extensive preferred orientation, with the c-axis of the $YBa_2Cu_3O_x$ coating perpendicular to the substrate surface. A typical diffraction pattern of such a coating is shown in FIG. 5. The principal impurity phases observed in the XRD analysis were cupric oxide, barium cuprate, and the 211 phase. Occasionally, barium carbonate or yttrium oxide is observed. The quantity of the impurity phases correlates relatively well with the chemical analysis of the coatings. For example, if the EDX analysis of the sample show the coating to be deficient in yttrium, the XRD analysis often reveals the presence of barium cuprate. On the other hand, if the coating is barium or copper deficient, the CuO or 211 phases will usually be observed in the XRD pattern.

Samples which were processed using the powder feed system of the method and apparatus of the present invention had coating growth rates of about four (4) microns per minute and exhibited superconductivity. Coating a substrate with $YBa_2Cu_3O_x$ used an initial charge of 5.0 grams of powder to the feeder having a reagent ratio of 1:1.38:1.51 of $Y(tmhd)_3:Ba(tmhd)_2:Cu(tmhd)_2$. This powder was fed into the horizontal reactor using five (5) liters per minute of oxygen flow at furnace conditions of 40 torr and 900° C. An analysis of the coating by x-ray diffraction, energy dispersive spectroscopy, and resistance versus temperature measurements was completed on dozens of samples.

Figure 4:
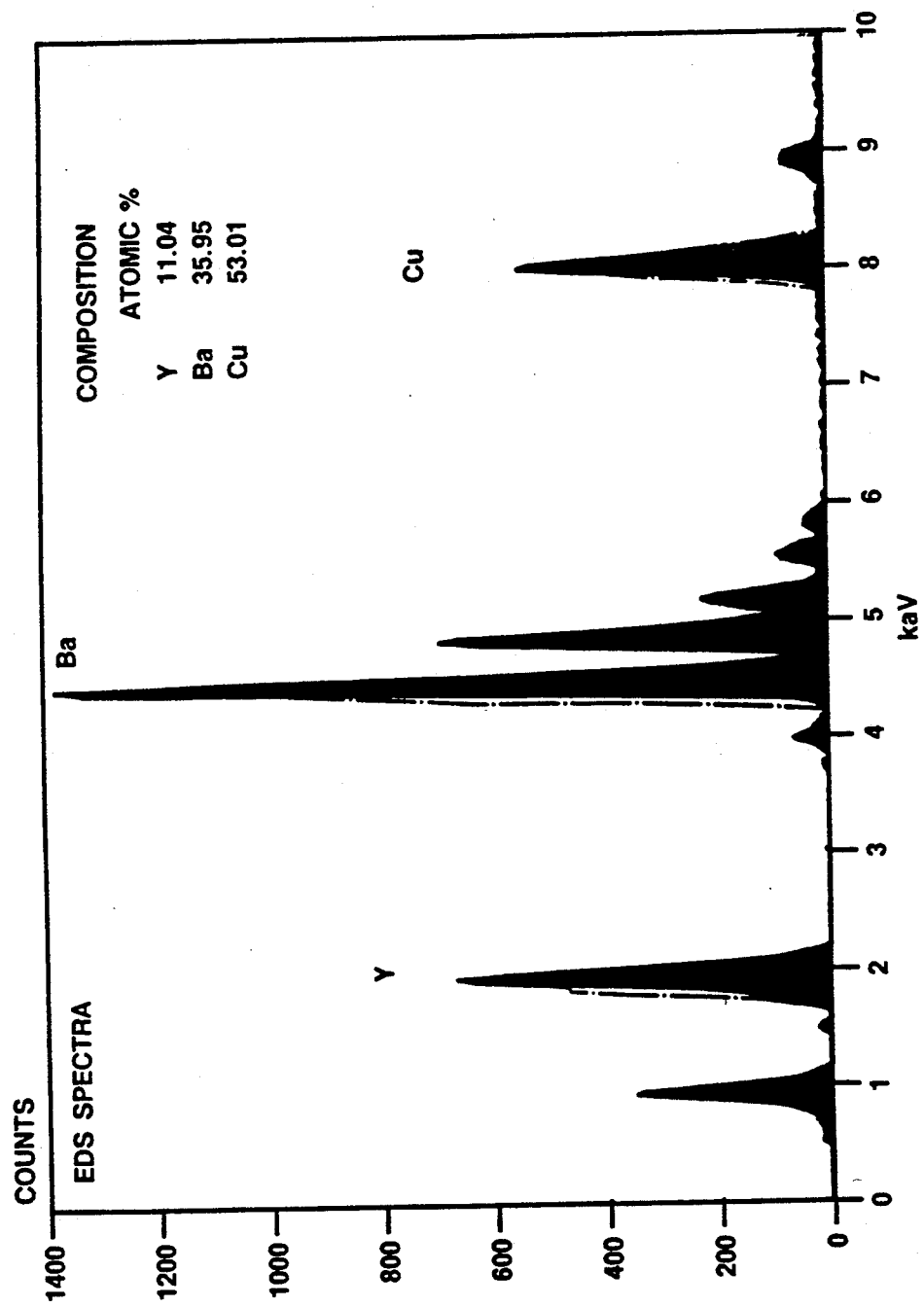
FIG. 4 is a sample EDS spectra showing the composition of $YBa_2Cu_3O_x$.
Figure 6:
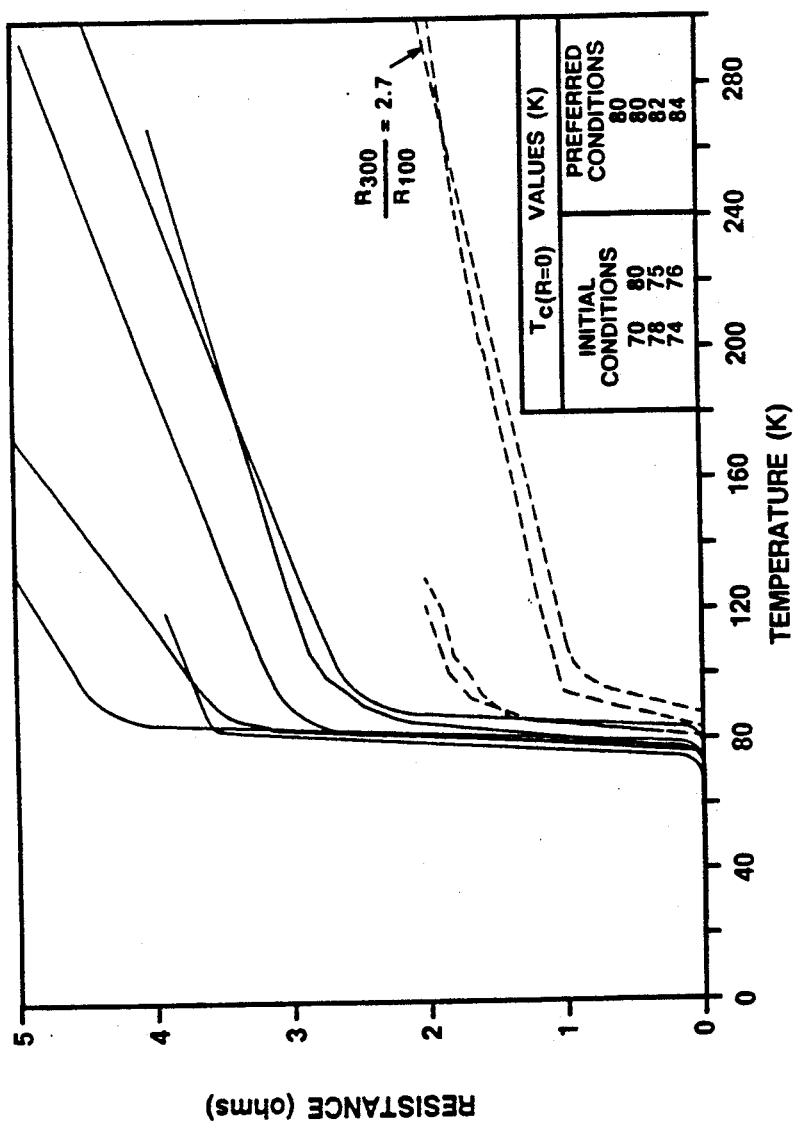
FIG. 6 is a sample graph showing the resistance versus the temperature of a sample coating of $YBa_2Cu_3O_x$ on an MgO substrate.

Typical results are presented in FIGS. 4–6. The results show successful deposition for several samples, including good repeatability. Profilometry, weight gain and scanning electron microscopy of fracture cross sections were used to determine coating thickness and therefore determine the deposition rate.

FIG. 4 shows that the coating achieved by this invention contains Y, Ba, and Cu in the approximate mole ratio 1:2:3. Coatings like this are slightly deficient in Y and are thought to be preferred, although coatings of various compositions may be prepared by deliberately varying the amount of $Y(tmhd)_3$, $Ba(tmhd)_2$, and $Cu(tmhd)_2$ in the feed powder.

The x-ray diffraction pattern of FIG. 5 is typical of the $YBa_2Cu_3O_x$ coating prepared using the present invention. These x-ray diffraction patterns, by virtue of the unusually intense $\{00p\}$ diffraction peaks, show the coating to be preferentially oriented with the basal plane parallel to the substrate surface.

FIG. 6 shows nine different samples of $YBa_2Cu_3O_x$, all of which were deposited using the powder feeding method. The difference in the initial and preferred conditions referred to in FIG. 6 is different ratios of $Y(tmhd_3)$, $Ba(tmhd_2)$, and $Cu(tmhd_2)$ in the feed powder. The $T_c$ values resulting are outstanding in that they significantly exceed the value of 66K, which is the maximum value for chemically vapor deposited $YBa_2Cu_3O_x$ on an MgO substrate previously reported.

The method and apparatus of the present invention has also resulted in a Tc(R=0) of 82K for a $YBa_2Cu_3O_x$ coating on Saphikon fiber. Saphikon is single crystal $Al_2O_3$ in the form of a 125 micron diameter fiber. This superconducting coating on a Saphikon fiber results in a flexible superconducting wire. Fiber tows of various compositions, such as polycrystalline $Al_2O_3$, and ribbons or tapes of $Al_2O_3$ or $ZrO_2$ may also be coated.

The process has the distinct advantage of higher reagent introduction rates, and therefore higher coating rates, than the conventional approach in which the reagents are vaporized in individual external vaporizers prior to introduction into the CVD furnace.

The invention is not intended to be limited to the examples given above. It is obvious that those skilled in the art may make modifications to the method or the apparatus or both, without departing from the spirit or scope of the invention which is defined by the subjoined claims.

What is claimed is:

1. A method for applying coatings to substrates using chemical vapor deposition in which low vapor pressure reagents are used comprising the steps of:
    (a) providing a substrate;
    (b) selecting a quantity of one or more powder reagents;
    (c) providing a furnace means;
    (d) providing a powder feeder means for introducing said reagent or reagents into said furnace means;
    (e) placing said substrate within said furnace means;
    (f) introducing said powder reagent or reagents into said furnace means; and
    (g) vaporizing and reacting said reagent or reagents within said furnace means resulting in the deposition from the vapor phase of a coating on said substrate.

2. A method for coating substrates as described in claim 1 wherein said substrate is selected from the group consisting of single crystal magnesium oxide, single crystal aluminum oxide, single crystal strontium titanate, single crystal zirconia, polycrystalline zirconia, zirconia tape, planar polycrystalline aluminum oxide, aluminum oxide fiber, silica fiber, mullite-like fiber, and aluminum oxide, zirconium oxide and metal tapes wire, cavities, and multi-filament tows.

3. The method for coating substrates as described in claim 1, wherein said reagents are selected from the group consisting of beta-diketonates, fluorinated beta-diketonates, acetylacetonate, acetate, and halides.

4. The method for coating substrates as described in claim 1, wherein said furnace means is a chemical vapor deposition reactor.

5. The method for coating substrates as described in claim 1, further comprising the step of entraining said reagents in a carrier gas which transports said reagents into said furnace means; wherein said entrainment step occurs immediately prior to step (f).

6. A method for coating substrates as claimed in claim 1, said coating further including constituents from the gas introduced with said reagents.

7. The method for coating substrates as described in claim 1, wherein said solid powder consists of particles having a diameter of less than 44 microns.

8. The method for coating substrates as described in claim 2, wherein said substrate is selected from the group consisting of planar, fiber, tape, cavity and electronic substrates.

9. The method for coating substrates as described in claim 3, wherein said coating is selected from the group consisting of $YBa_2Cu_3O_x$, $Sr_2CuO_6$, $Ca_2CuO_6$, $Bi_2Sr_2Ca_2Cu_3O_{10}$, $Tl_2(Ca,Ba)_2CuO_6$, $Bi_2CuO_6$, $Tl_2Ca_2CuO_6$, $Tl_2Ba_2CuO_6$, other oxide superconductors containing Bi, Sr, Ca, Tl or other rare earth metals, yttria, magnesia, barium titanate, rare earth oxides, carbides, nitrides, and borides.

10. The method for coating substrates as described in claim 4, wherein said furnace is oriented in a horizontal position.

11. The method for coating substrates as described in claim 4, wherein said furnace is oriented in a vertical position.

12. The method for coating substrates as described in claim 5, wherein said carrier gas is selected from the group consisting of oxygen and inert gases.

13. A method for applying coatings to substrates using chemical vapor deposition comprising the steps of:
    (a) selecting a quantity of one or more low vapor pressure powdered reagents;
    (b) providing a furnace means;
    (c) placing said substrate within said furnace means;
    (d) providing a powder means for introducing said powdered reagent or reagents into said furnace, said feeder means including an entraining means for entraining said powdered reagent or reagents in a carrier gas, and introducing said powdered reagent and reagents into said furnace means; and
    (e) reacting said powdered reagent or reagents within said furnace means resulting in the deposition from the vapor phase of a coating on said substrate.

14. The method for coating substrates as described in claim 13, wherein said carrier gas is oxygen.

15. The method for coating substrates as described in claim 13 further comprising the step of introducing oxygen to said furnace means prior to step (e), wherein said carrier gas is selected from the group consisting of inert gases.

* * * * *